United States Patent
Zhao et al.

(10) Patent No.: US 10,190,210 B2
(45) Date of Patent: Jan. 29, 2019

(54) NEAR-FIELD TRANSDUCER HAVING AT LEAST ONE SECONDARY ATOM

(71) Applicant: SEAGATE TECHNOLOGY LLC, Cupertino, CA (US)

(72) Inventors: Tong Zhao, Eden Prairie, MN (US); Michael C. Kautzky, Eagan, MN (US); Sarbeswar Sahoo, Shakopee, MN (US); Justin Brons, Savage, MN (US); Jie Gong, Eden Prairie, MN (US); Yuhang Cheng, Edina, MN (US)

(73) Assignee: Seagate Technology LLC, Cupertino, CA (US)

(*) Notice: Subject to any disclaimer, the term of this patent is extended or adjusted under 35 U.S.C. 154(b) by 0 days.

(21) Appl. No.: 15/817,503

(22) Filed: Nov. 20, 2017

(65) Prior Publication Data

US 2018/0073135 A1    Mar. 15, 2018

Related U.S. Application Data

(63) Continuation of application No. 14/938,018, filed on Nov. 11, 2015, now Pat. No. 9,822,444.
(Continued)

(51) Int. Cl.
*G11B 11/105* (2006.01)
*C23C 14/58* (2006.01)
(Continued)

(52) U.S. Cl.
CPC .......... *C23C 14/5806* (2013.01); *G11B 5/314* (2013.01); *G11B 5/6088* (2013.01); *G11B 2005/0021* (2013.01)

(58) Field of Classification Search
None
See application file for complete search history.

(56) References Cited

U.S. PATENT DOCUMENTS

| 6,795,630 B2 | 9/2004 | Challener |
| 6,999,384 B2 | 2/2006 | Stancil |

(Continued)

FOREIGN PATENT DOCUMENTS

| EP | 024088 | 10/1987 |
| EP | 0580368 | 1/1994 |

(Continued)

OTHER PUBLICATIONS

Al-Bayati et al., Junction Profiles of Sub keV Ion Implantation for Deep Sub-Quarter Micron Devices, IEEE, 2000, pp. 87-90.
(Continued)

*Primary Examiner* — Tan X Dinh
(74) *Attorney, Agent, or Firm* — Mueting, Raasch & Gebhardt, P.A.

(57) ABSTRACT

Devices having an air bearing surface (ABS), the device including a near field transducer, the near field transducer having a peg and a disc, the peg having a region adjacent the ABS, the peg including a plasmonic material selected from gold (Au), silver (Ag), copper (Cu), ruthenium (Ru), rhodium (Rh), aluminum (Al), or combinations thereof; and at least one other secondary atom selected from germanium (Ge), tellurium (Te), aluminum (Al), antimony (Sb), tin (Sn), mercury (Hg), indium (In), zinc (Zn), iron (Fe), copper (Cu), manganese (Mn), silver (Ag), chromium (Cr), cobalt (Co), and combinations thereof, wherein a concentration of the secondary atom is higher at the region of the peg adjacent the ABS than a concentration of the secondary atom throughout the bulk of the peg. Methods of forming NFTs are also disclosed.

14 Claims, 2 Drawing Sheets

Related U.S. Application Data

(60) Provisional application No. 62/078,096, filed on Nov. 11, 2014.

(51) Int. Cl.
   *G11B 5/31* (2006.01)
   *G11B 5/00* (2006.01)
   *G11B 5/60* (2006.01)

(56) References Cited

U.S. PATENT DOCUMENTS

| | | |
|---|---|---|
| 7,018,729 B2 | 3/2006 | Pocker |
| 7,032,427 B2 | 4/2006 | Niwa |
| 7,262,936 B2 | 8/2007 | Hamann |
| 7,272,079 B2 | 9/2007 | Challener |
| 7,330,404 B2 | 2/2008 | Peng |
| 7,377,228 B2 | 5/2008 | Mack |
| 7,538,978 B2 | 5/2009 | Sato |
| 7,544,958 B2 | 6/2009 | Low |
| 7,609,003 B2 | 10/2009 | Horsky |
| 7,690,009 B2 | 3/2010 | Miyanishi |
| 7,791,839 B2 | 9/2010 | Olson |
| 7,961,417 B2 | 6/2011 | Seigler |
| 7,965,464 B2 | 6/2011 | Batra |
| 7,986,592 B2 | 7/2011 | Hirano |
| 8,023,225 B2 | 9/2011 | Shimazawa |
| 8,031,561 B2 | 10/2011 | Hellwing |
| 8,040,761 B2 | 10/2011 | Kawamori |
| 8,077,556 B2 | 12/2011 | Komura |
| 8,107,325 B2 | 1/2012 | Komura |
| 8,116,034 B2 | 2/2012 | Komura |
| 8,116,176 B2 | 2/2012 | Kato |
| 8,194,510 B2 | 6/2012 | Sasaki |
| 8,194,511 B2 | 6/2012 | Sasaki |
| 8,213,272 B2 | 7/2012 | Takayama |
| 8,223,597 B2 | 7/2012 | Komura |
| 8,248,891 B2 | 8/2012 | Lee |
| 8,284,521 B2 | 10/2012 | Ohtsu |
| 8,284,635 B2 | 10/2012 | Matsumoto |
| 8,289,650 B2 | 10/2012 | Seigler |
| 8,320,220 B1 | 11/2012 | Yuan |
| 8,325,567 B2 | 12/2012 | Miyauchi |
| 8,331,205 B2 | 12/2012 | Seigler |
| 8,339,740 B2 | 12/2012 | Zou |
| 8,351,151 B2 | 1/2013 | Katine |
| 8,385,159 B2 | 2/2013 | Gao |
| 8,391,106 B2 | 3/2013 | Shimazawa |
| 8,400,902 B2 | 3/2013 | Huang |
| 8,405,932 B2 | 3/2013 | Seigler |
| 8,416,647 B1 | 4/2013 | Zhao |
| 8,427,925 B2 | 4/2013 | Zhao |
| 8,451,555 B2 | 5/2013 | Seigler |
| 8,477,454 B2 | 7/2013 | Zou |
| 8,514,673 B1* | 8/2013 | Zhao ............... G11B 5/3133 369/13.33 |
| 8,553,505 B2 | 10/2013 | Rawat |
| 8,670,215 B2 | 3/2014 | Zou |
| 8,675,457 B1 | 3/2014 | Hirata |
| 8,711,662 B2 | 4/2014 | Lee |
| 8,733,959 B2 | 5/2014 | Moriya |
| 8,830,800 B1 | 9/2014 | Pitcher |
| 8,842,391 B2 | 9/2014 | Zhao |
| 8,917,581 B1 | 12/2014 | Mallary |
| 8,934,198 B2 | 1/2015 | Zou |
| 8,958,168 B1 | 2/2015 | Yuan |
| 9,245,573 B2 | 1/2016 | Sahoo |
| 9,502,070 B2* | 11/2016 | Cheng ............... G11B 5/314 369/13.33 |
| 9,822,444 B2* | 11/2017 | Zhao ............... C23C 14/5806 369/13.33 |
| 2005/0190496 A1 | 9/2005 | Hamann |
| 2007/0069383 A1 | 3/2007 | Suzuki |
| 2009/0073858 A1 | 3/2009 | Seigler |
| 2009/0130365 A1 | 5/2009 | Kojima |
| 2009/0225636 A1 | 9/2009 | Hirano |
| 2010/0103553 A1 | 4/2010 | Shimazawa |
| 2010/0128579 A1 | 5/2010 | Seigler |
| 2010/0149930 A1 | 6/2010 | Komura |
| 2010/0157746 A1 | 6/2010 | Hongo |
| 2010/0214685 A1 | 8/2010 | Seigler |
| 2010/0309581 A1 | 12/2010 | Wu |
| 2010/0315736 A1 | 12/2010 | Takayama |
| 2011/0038236 A1 | 2/2011 | Mizuno |
| 2011/0058272 A1 | 3/2011 | Miyauchi |
| 2011/0122735 A1 | 5/2011 | Kato |
| 2011/0205863 A1 | 8/2011 | Zhao |
| 2012/0045662 A1 | 2/2012 | Zou |
| 2012/0105996 A1 | 5/2012 | Katine |
| 2012/0127839 A1 | 5/2012 | Rawat |
| 2012/0213042 A1 | 8/2012 | Aoki |
| 2012/0201491 A1 | 9/2012 | Zhou |
| 2013/0107679 A1 | 5/2013 | Huang |
| 2013/0108212 A1 | 5/2013 | Peng |
| 2013/0176839 A1 | 7/2013 | Peng |
| 2013/0235707 A1 | 9/2013 | Zhao |
| 2013/0279315 A1 | 10/2013 | Zhao |
| 2013/0286799 A1 | 10/2013 | Zhu |
| 2013/0286804 A1 | 10/2013 | Zhao |
| 2014/0043948 A1 | 2/2014 | Hirata |
| 2014/0050057 A1 | 2/2014 | Zou |
| 2014/0050058 A1 | 2/2014 | Zou |
| 2014/0113160 A1 | 4/2014 | Pitcher |
| 2014/0254335 A1 | 9/2014 | Gage |
| 2014/0376346 A1 | 12/2014 | Sahoo |
| 2014/0376347 A1 | 12/2014 | Brons |
| 2014/0376349 A1* | 12/2014 | Cheng ............... G11B 5/6088 369/13.33 |
| 2014/0376350 A1* | 12/2014 | Cheng ............... G11B 5/4866 369/13.33 |
| 2014/0376351 A1* | 12/2014 | Cheng ............... G11B 5/314 369/13.33 |
| 2014/0376352 A1 | 12/2014 | Cheng |
| 2015/0132503 A1 | 5/2015 | Kautzky |
| 2015/0162028 A1 | 6/2015 | Jayashankar |
| 2015/0162030 A1 | 6/2015 | Jayashankar |
| 2015/0179194 A1 | 6/2015 | Cheng |
| 2015/0340052 A1* | 11/2015 | Sankar ............... G11B 5/6088 369/13.33 |
| 2015/0380020 A1 | 12/2015 | Cheng |
| 2016/0133277 A1* | 5/2016 | Cheng ............... C23C 8/02 369/13.33 |
| 2016/0275972 A1* | 9/2016 | Zhao ............... G11B 5/314 369/13.33 |
| 2017/0263276 A1* | 9/2017 | Sankar ............... G11B 5/6088 369/13.33 |

FOREIGN PATENT DOCUMENTS

| | | |
|---|---|---|
| EP | 0942072 | 9/1999 |
| EP | 1328027 | 7/2003 |
| EP | 2106678 | 10/2009 |
| JP | 2011198450 | 10/2011 |
| JP | 20111238991 | 12/2011 |
| TW | 200929183 | 7/2009 |
| WO | WO 97/45834 | 12/1997 |
| WO | WO 2013/163195 | 10/2013 |
| WO | WO 2013/163470 | 10/2013 |

OTHER PUBLICATIONS

Angel et al., "Enhanced Low Energy Drift-Mode Beam Currents in a High Current Ion Implanter," IEEE, 1999, pp. 219-222.

Bannuru et al., "The Electrical and Mechanical Properties of Au—V and Au-V205 Thin Films for Wear-Resistant RF MEMS Switches", Journal of Applied Physics, 103, (2008), pp. 083522-1-083522-6.

Druz et al., "Diamond-Like Carbon Films Deposited Using a Broad, Uniform Ion Beam from an RF Inductively Coupled CH4-Plasma Source", Diamond and Related Materials, vol. 7, No. 7, Jul. 1998, pp. 965-972.

(56) References Cited

OTHER PUBLICATIONS

Liu et al., "Influence of the Incident Angle of Energetic Carbon Ions on the Properties of Tetrahedral Amorphous Carbon (ta-C) films", Journal of Vacuum Science and Technology, vol. 21, No. 5, Jul. 25, 2003, pp. 1665-1670.

Metallization: "Metallization"; chapter 5, In: Kris v. Srikrishnan and Geraldine C. Schwartz: "Handbook of Semiconductor Interconnection Technology, Second Edition", 2006, CRC Press, Boca Raton, FL, USA, XP002711255, ISBN:978-1-4200-1765-6, pp. 311-382, Section 5.4.1.2 Adhesion; p. 320.

PCT/US2013/038120 Search Report and Written Opinion dated Jul. 19, 2013 (8 pages).

Piazza et al., "Large Area Deposition of Hydrogenated Amorphous Carbon Films for Optical Storage Disks", Diamond and Related Materials, vol. 13, No. 4-8, Apr. 2004, pp. 1505-1510.

Robertson, J., "Diamond-Like Amorphous Carbon," *Materials Science and Engineering R* 37, 2002, pp. 129-281.

Satoh et al., "Evaluation of Adhesion Materials for Gold Line-and-Space Surface Plasmon Antenna on SO1-MOS Photodiode", Silicon Nanoelectronics Workshop (SNW), 2010, IEEE, Piscataway, NJ, USA, Jun. 13, 2010, pp. 1-2.

Vogt, K.W. et al., "Characterization of Thin Titanium Oxide Adhesion Layers on Gold Resistivity, Morphology, and Composition", Surface Science, North-Holland, Amsterdam, NL, vol. 301, No. 1-3, Jan. 10, 1994, pp. 203-213.

Williams et al., "Strenghtening Gold Thin Films with Zirconia Nanoparticles for MEMS Electrical Contacts", Acta Materialia 56, (2008), pp. 1813-1819.

\* cited by examiner

NEAR-FIELD TRANSDUCER HAVING AT LEAST ONE SECONDARY ATOM

PRIORITY

This application is a continuation of U.S. patent application Ser. No. 14/938,018, filed Nov. 11, 2015, now U.S. Pat. No. 9,822,444 and which claims priority to U.S. Provisional Application No. 62/078,096 entitled "NEAR FIELD TRANSDUCERS INCLUDING DOPANTS" filed on Nov. 11, 2014, the disclosure of which is incorporated herein by reference thereto.

SUMMARY

Disclosed are devices having an air bearing surface (ABS), the device including a near field transducer, the near field transducer having a peg and a disc, the peg having a region adjacent the ABS, the peg including a plasmonic material selected from gold (Au), silver (Ag), copper (Cu), ruthenium (Ru), rhodium (Rh), aluminum (Al), or combinations thereof; and at least one other secondary atom selected from germanium (Ge), tellurium (Te), aluminum (Al), antimony (Sb), tin (Sn), mercury (Hg), indium (In), zinc (Zn), iron (Fe), copper (Cu), manganese (Mn), silver (Ag), chromium (Cr), cobalt (Co), and combinations thereof, wherein a concentration of the secondary atom is higher at the region of the peg adjacent the ABS than a concentration of the secondary atom throughout the bulk of the peg.

Also disclosed are devices that include a light source; a waveguide; and a near field transducer, the near field transducer having a peg and a disc, the peg having a region adjacent the ABS, the peg including a plasmonic material selected from gold (Au), silver (Ag), copper (Cu), ruthenium (Ru), rhodium (Rh), aluminum (Al), or combinations thereof; and at least one other secondary atom selected from germanium (Ge), tellurium (Te), aluminum (Al), antimony (Sb), tin (Sn), mercury (Hg), indium (In), zinc (Zn), iron (Fe), copper (Cu), manganese (Mn), silver (Ag), chromium (Cr), cobalt (Co), and combinations thereof, wherein a concentration of the secondary atom is higher at the region of the peg adjacent the ABS than a concentration of the secondary atom throughout the bulk of the peg and wherein the light source, waveguide and near field transducer are configured to transmit light from the light source to the waveguide and finally the near field transducer.

Also disclosed are methods of forming a NFT, the method including forming a structure including plasmonic material and at least one secondary atom, the at least one secondary atom selected from: germanium (Ge), tellurium (Te), aluminum (Al), antimony (Sb), tin (Sn), mercury (Hg), indium (In), zinc (Zn), iron (Fe), copper (Cu), manganese (Mn), silver (Ag), chromium (Cr), cobalt (Co), and combinations thereof; forming a NFT from the structure including plasmonic material and at least one secondary atom, the NFT comprising a peg and a disc, the peg having a region adjacent the ABS; and annealing at least a portion of the NFT to affect diffusion of the at least one secondary atom to the region of the peg adjacent the ABS.

The above summary of the present disclosure is not intended to describe each disclosed embodiment or every implementation of the present disclosure. The description that follows more particularly exemplifies illustrative embodiments. In several places throughout the application, guidance is provided through lists of examples, which examples can be used in various combinations. In each instance, the recited list serves only as a representative group and should not be interpreted as an exclusive list.

BRIEF DESCRIPTION OF THE FIGURES

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Heat assisted magnetic recording (referred to through as HAMR) utilizes radiation, for example from a laser, to heat media to a temperature above its curie temperature, enabling magnetic recording. In order to deliver the radiation, e.g., a laser beam, to a small area (on the order of 20 to 50 nm for example) of the medium, a NFT is utilized. During a magnetic recording operation, the NFT absorbs energy from a laser and focuses it to a very small area; this can cause the temperature of the NFT to increase. The temperature of the NFT can be elevated up to about 400° C. or more.

The very high temperatures that the NFT reaches during operation can lead to diffusion of the material of the NFT (for example gold) from the peg and towards the disk. In addition, a portion of the NFT may be exposed at the air bearing surface of the recording head and is thus subject to mechanical wearing. NFT performance is greatly influenced by the heat and mechanical stress during HAMR operation. It would therefore be advantageous to have NFT devices that are more durable.

Disclosed devices can offer the advantage of providing more efficient transfer of energy from an energy source to the magnetic storage media to be heated, a smaller focal point at the point of heating, or some combination thereof. In some embodiments, disclosed devices can be used within other devices or systems, such as magnetic recording heads, more specifically, thermally or heat assisted magnetic recording (HAMR) heads, or disc drives that include such devices. Disclosed devices can also improve or enhance NFT stability by decreasing the rate, amount, or both of the plasmonic material atoms from the peg tip back towards the disc.

Figure 1:
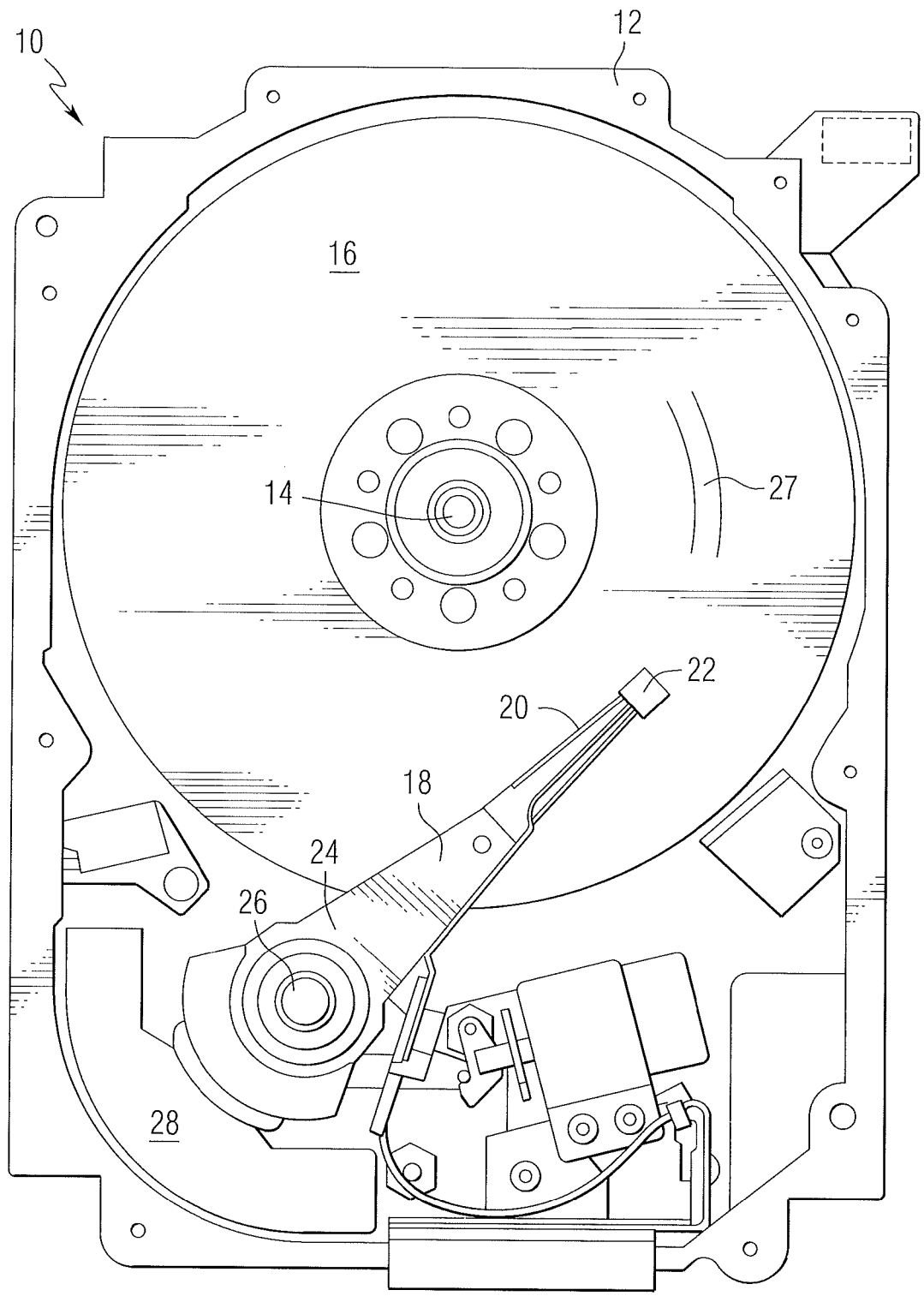
FIG. 1 is a pictorial representation of a data storage device in the form of a disc drive that can include a recording head constructed in accordance with an aspect of this disclosure.

Disclosed herein are NFTs and devices that include such NFTs. FIG. 1 is a pictorial representation of a data storage device in the form of a disc drive 10 that can utilize disclosed NFTs. The disc drive 10 includes a housing 12 (with the upper portion removed and the lower portion visible in this view) sized and configured to contain the various components of the disc drive. The disc drive 10 includes a spindle motor 14 for rotating at least one magnetic storage media 16 within the housing. At least one arm 18 is contained within the housing 12, with each arm 18 having a first end 20 with a recording head or slider 22, and a second end 24 pivotally mounted on a shaft by a bearing 26. An actuator motor 28 is located at the arm's second end 24 for pivoting the arm 18 to position the recording head 22 over a desired sector or track 27 of the disc 16. The actuator motor 28 is regulated by a controller, which is not shown in this view and is well-known in the art. The storage media may include, for example, continuous media or bit patterned media.

For heat assisted magnetic recording (HAMR), electromagnetic radiation, for example, visible, infrared or ultraviolet light is directed onto a surface of the data storage media to raise the temperature of a localized area of the media to facilitate switching of the magnetization of the area. Recent designs of HAMR recording heads include a thin film waveguide on a slider to guide light toward the storage media and a near field transducer to focus the light to a spot size smaller than the diffraction limit. While FIG. 1 shows a disc drive, disclosed NFTs can be utilized in other devices that include a near field transducer.

Figure 2:
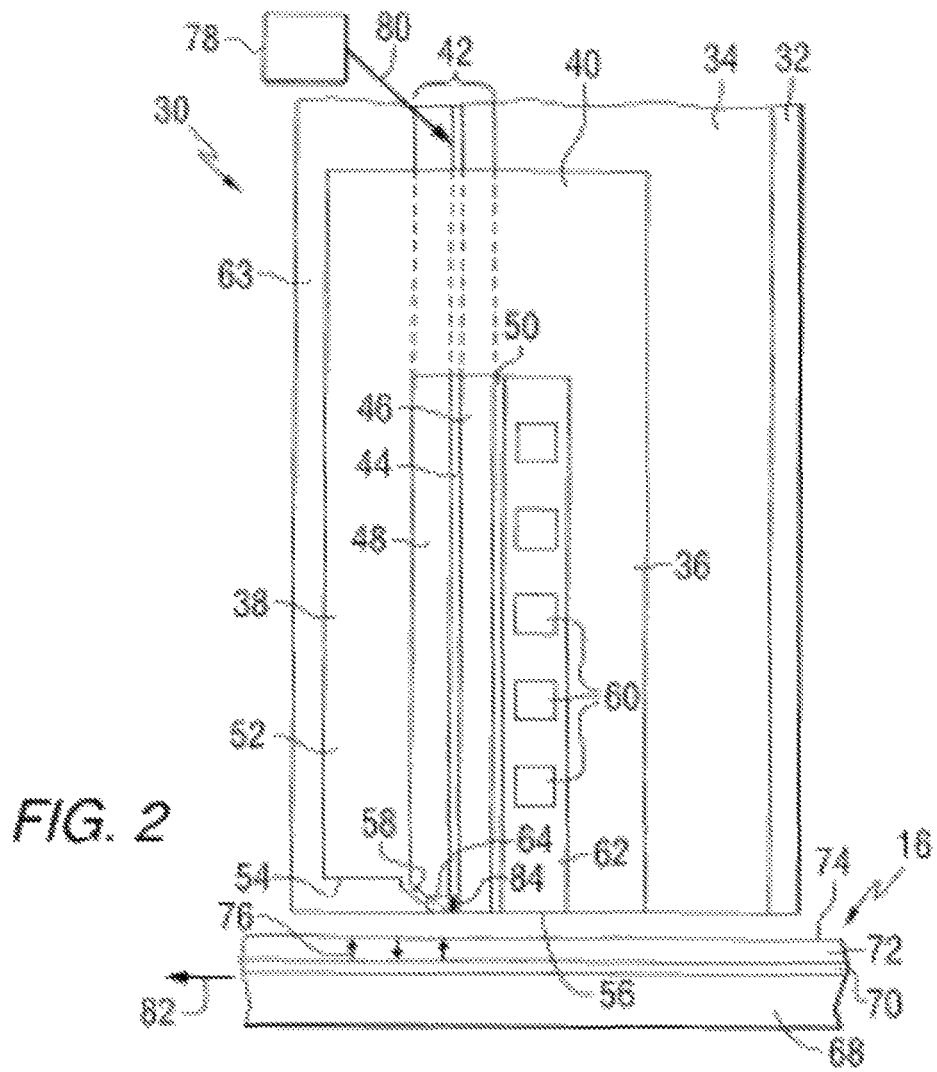
FIG. 2 is a side elevation view of a recording head constructed in accordance with an aspect of the invention.

FIG. 2 is a side elevation view of a recording head that may include a disclosed NFT; the recording head is positioned near a storage media. The recording head 30 includes a substrate 32, a base coat 34 on the substrate, a bottom pole 36 on the base coat, and a top pole 38 that is magnetically coupled to the bottom pole through a yoke or pedestal 40. A waveguide 42 is positioned between the top and bottom poles. The waveguide includes a core layer 44 and cladding layers 46 and 48 on opposite sides of the core layer. A mirror 50 is positioned adjacent to one of the cladding layers. The top pole is a two-piece pole that includes a first portion, or pole body 52, having a first end 54 that is spaced from the air bearing surface 56, and a second portion, or sloped pole piece 58, extending from the first portion and tilted in a direction toward the bottom pole. The second portion is structured to include an end adjacent to the air bearing surface 56 of the recording head, with the end being closer to the waveguide than the first portion of the top pole. A planar coil 60 also extends between the top and bottom poles and around the pedestal. In this example, the top pole serves as a write pole and the bottom pole serves as a return pole.

An insulating material 62 separates the coil turns. In one example, the substrate can be AlTiC, the core layer can be $Ta_2O_5$, and the cladding layers (and other insulating layers) can be $Al_2O_3$. A top layer of insulating material 63 can be formed on the top pole. A heat sink 64 is positioned adjacent to the sloped pole piece 58. The heat sink can be comprised of a non-magnetic material, such as for example Au.

As illustrated in FIG. 2, the recording head 30 includes a structure for heating the magnetic storage media 16 proximate to where the write pole 58 applies the magnetic write field H to the storage media 16. In this example, the media 16 includes a substrate 68, a heat sink layer 70, a magnetic recording layer 72, and a protective layer 74. However, other types of media, such as bit patterned media can be used. A magnetic field H produced by current in the coil 60 is used to control the direction of magnetization of bits 76 in the recording layer of the media.

The storage media 16 is positioned adjacent to or under the recording head 30. The waveguide 42 conducts light from a source 78 of electromagnetic radiation, which may be, for example, ultraviolet, infrared, or visible light. The source may be, for example, a laser diode, or other suitable laser light source for directing a light beam 80 toward the waveguide 42. Specific exemplary types of light sources 78 can include, for example laser diodes, light emitting diodes (LEDs), edge emitting laser diodes (EELs), vertical cavity surface emitting lasers (VCSELs), and surface emitting diodes. In some embodiments, the light source can produce energy having a wavelength of 830 nm, for example. Various techniques that are known for coupling the light beam 80 into the waveguide 42 may be used. Once the light beam 80 is coupled into the waveguide 42, the light propagates through the waveguide 42 toward a truncated end of the waveguide 42 that is formed adjacent the air bearing surface (ABS) of the recording head 30. Light exits the end of the waveguide and heats a portion of the media, as the media moves relative to the recording head as shown by arrow 82. A near-field transducer (NFT) 84 is positioned in or adjacent to the waveguide and at or near the air bearing surface. The heat sink material may be chosen such that it does not interfere with the resonance of the NFT.

Although the example of FIG. 2 shows a perpendicular magnetic recording head and a perpendicular magnetic storage media, it will be appreciated that the disclosure may also be used in conjunction with other types of recording heads and/or storage media where it may be desirable to concentrate light to a small spot.

Figure 3:
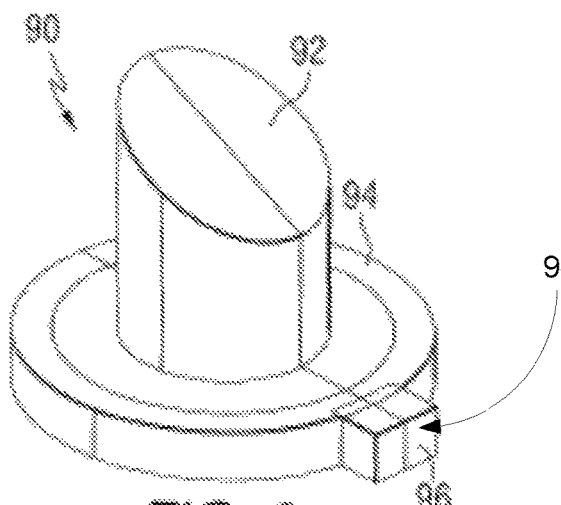
FIG. 3 is a schematic representation of a near field transducer.

FIG. 3 is a schematic view of a NFT 90 in combination with an optional heat sink 92. The NFT includes a disk shaped portion 94 and a peg 96 extending from the disk shaped portion. The heat sink 92 can be positioned between the disk shaped portion and the sloped portion of the top pole in FIG. 2. When mounted in a recording head, the peg may be exposed at the ABS and thus can be subjected to mechanical wearing. The surface 98 of the peg 96 will be exposed at the ABS when included in a recording head.

Possible explanations for recession of the peg (away from the ABS surface 98) can include void nucleation via vacancy/effect condensation at the peg tip due to the excessive power density and temperature and/or topographic flaws (e.g., grain boundaries, head overcoat steps/scratches, etc.) and void growth inward (e.g., atoms, for example gold atoms) move away from the peg tip and vacancies move towards the peg tip. The second mechanism may be facilitated by rapid plasmonic material (e.g., gold)/oxide (head overcoat) interface diffusion. One method of reducing or diminishing the effect of interface diffusion is to use metal adhesives at the plasmonic material/oxide interfaces to eliminate or minimize interface diffusion paths. The interface at the surface 98, where the interface is formed by the peg and an overlying head overcoat (not shown in FIG. 3). If the metal adhesive is to be utilized at the plasmonic material/head overcoat interface, the metal adhesive region needs to be limited to the peg tip region in order to avoid electrically shunting the reader. Thus, an area selective method would be needed to form the adhesive region at the peg-tip/head overcoat interface. This is challenging utilizing traditional processes and therefore additional methods of affecting the recession mechanisms are necessary.

Disclosed herein are methods of preventing or minimizing plasmonic material atoms, vacancies, or both from migrating within the peg and especially the peg tip. Furthermore, methods of relatively easily (from a processing standpoint) forming an adhesive layer at the peg tip/head overcoat interface are also disclosed. In prior NFTs, plasmonic atom vacancies diffuse towards the tip of the peg, which is thought to lead to recession and likely failure of the NFT and head. Disclosed NFTs include a metal with relatively high diffusivity in the plasmonic material, for example a diffusivity that is higher in the plasmonic material than that of the plasmonic material in itself. In this way, the metal diffuses to the tip of the peg. This may provide various benefits, including, for example: preventing or minimizing plasmonic material atoms and/or vacancies from migrating in order to stop void growth at the peg tip and thus make the NFT structure more stable; providing adhesion between the plasmonic material and the head overcoat (e.g., the adhesive metals will be self-aligned with the peg tip so there is no risk of reader shunting) via a relatively easy process (e.g., easier than patterning at the ABS); preventing or cutting off the diffusion path by forming an oxide at the peg tip (the metallic portion or the sub-oxide portion of the metallic oxide will still provide adhesion benefit); combinations thereof.

The particular atom(s) to be added into the plasmonic material can be chosen based on various properties. For example, the diffusivity of the metal in the plasmonic material can be compared to the self-diffusivity of the plasmonic material. In some embodiments, metals that can be added to plasmonic materials can have a diffusivity in that material that is at least equal to or greater than the self-diffusivity of the plasmonic material. In some embodiments, metals that can be added to plasmonic materials can have a diffusivity in that material that is greater than the self-diffusivity of the plasmonic material. In some embodiments, metals that can be added to plasmonic materials can have a diffusivity in that material that is substantially greater than the self-diffusivity of the plasmonic material.

As an example, assuming that the plasmonic material is gold (Au), Table 1 below provides diffusivity of various metals, including gold, in gold.

As seen from Table 1, the following metals may be useful in combination with gold to provide advantages such as those discussed above because they have a diffusivity in gold that is higher than the self-diffusivity of gold: germanium (Ge), tellurium (Te), aluminum (Al), antimony (Sb), tin (Sn), mercury (Hg), indium (In), zinc (Zn), iron (Fe), copper (Cu), manganese (Mn), silver (Ag), chromium (Cr), cobalt (Co), and combinations thereof.

Other properties that may be considered, in place of diffusivity or in addition to diffusivity can include, for example the enthalpy of segregation ($H_{seg}$), the solid solubility in the plasmonic material, and the Gibbs free energy of the formation of the oxide (to indicate the tendency of segregation) for example.

In some embodiments, secondary atoms that may be utilized can include, for example germanium (Ge), tellurium (Te), aluminum (Al), antimony (Sb), tin (Sn), mercury (Hg), indium (In), zinc (Zn), iron (Fe), copper (Cu), manganese (Mn), silver (Ag), chromium (Cr), cobalt (Co), and combinations thereof. In some embodiments, secondary atoms that may be utilized can include, for example germanium (Ge), aluminum (Al), antimony (Sb), zinc (Zn), iron (Fe), copper (Cu), manganese (Mn), silver (Ag), chromium (Cr), cobalt (Co), or combinations thereof. In some embodiments, secondary atoms that may be utilized can include, for example iron (Fe), cobalt (Co), germanium (Ge), aluminum (Al), antimony (Sb), or combinations thereof. In some embodiments, secondary atoms that may be utilized can include, for example mercury (Hg).

In some embodiments, it may be advantageous to prevent or minimize segregation and accumulation at NFT/oxide interfaces other than the ABS (e.g., the top, bottom and sides of peg) as it might reduce the benefit of segregation to the peg tip, cause higher optical penalty by adding an optically lossy material around the NFT, or combinations thereof. Different lattice planes (e.g., Au lattice planes) have different surface energies. As such, deposition of the plasmonic material could be configured to form a (111) oriented peg. The top and the bottom of the peg could be (111) oriented, which would give them a relatively low surface energy (e.g., Au orientation (111)—surface energy 1.28 J/m$^2$; (100)—surface energy 1.63 J/m$^2$; and (110) surface energy 1.70 J/m$^2$). The metal that is added to the plasmonic material would be energetically favored to segregate to the tip of the peg (non-(111) oriented) in order to lower the overall surface energy of the system.

Disclosed NFTs may be made of a primary atom and at least one secondary atom. In some embodiments, the primary atom may have a higher atomic percentage (at %) in the NFT. In some embodiments, the primary atom may be gold (Au). Alternatively, the primary atom may be some other material that has plasmonic properties. For example, the primary atom may be silver (Ag), copper (Cu), aluminum (Al), rhodium (Rh), or ruthenium (Ru) for example. In some embodiments, more than one secondary atom is included in a NFT. A secondary atom(s) may be chosen by considering one or more properties of the primary atom and potential secondary atoms. Illustrative properties can include, for example diffusivity of the secondary atom in the primary atom, diffusivity of the secondary atom in the primary atom versus self-diffusion of the primary atom, or combinations thereof.

Generally, a NFT can include a primary atom and at least one secondary atom. In some embodiments, the secondary atom(s) can have an atomic percent (at %) that is not greater than 50 at %, in some embodiments, not greater than 30 at %, in some embodiments, not greater than 5 at %, and in some embodiments, not greater than 1 at %. In some embodiments, the amount of the secondary atom can be not greater than 100 ppm (0.01 at %), in some embodiments not greater than 5 at %, or in some embodiments not greater than 10 at %. In some embodiments, the amount of the secondary atom can be not less than 10 ppm (0.001 at %), in some embodiments not less than 50 ppm (0.005 at %), or in some embodiments not less than 100 ppm (0.01 at %). In some embodiments, the amount of the secondary atom can be chosen so that a desired thickness of the secondary atom at the peg is formed once annealing has been performed.

Various methods and processes can be utilized herein to form NFTs that include a plasmonic material and a secondary atom such as those illustrated above. One such method can include the following steps. First, the plasmonic material and the metal is co-sputtered (either from a single composite target or two separate targets) to form an alloy of the two. The NFT structure can then be formed using known patterning and formation methods typically utilized in wafer processing. A heat treatment can be applied to the structure at this point. Once the NFT has been formed (and optionally heat treated), a head overcoat (HOC) can be deposited and the air bearing surface (ABS) can be formed using typically utilized wafer processing methods. NFT (and the HOC) can be heat treated at this point (whether it has or has not already been heat treated). The heat treatment (at either or both points in the process) is designed to cause the secondary atom (e.g., the metal) in the alloy making up the NFT to diffuse to the peg tip. The annealing can include an annealing step that is specifically designed to affect this diffusion, it can be done through the operation of the HAMR head itself as it heats up when utilized, or combinations thereof.

Another method includes forming a multilayer structure including layers of the plasmonic material alternating with layers of the secondary atom (e.g., the metal). In some embodiments, the layers of secondary atoms can be thinner, in some embodiments significantly thinner than the layers of plasmonic material. Thinner layers of secondary atoms allow only the desired amount of secondary atom in the final "total" of material (e.g., plasmonic material plus secondary atom). The NFT structure can then be formed using known patterning and formation methods typically utilized in wafer processing. A heat treatment can be applied to the structure at this point. Once the NFT has been formed (and optionally heat treated), a head overcoat (HOC) can be deposited and the air bearing surface (ABS) can be formed using typically utilized wafer processing methods. NFT (and the HOC) can be heat treated at this point (whether it has or has not already been heat treated). The heat treatment is designed to cause the secondary atom (e.g., the metal) from the multilayer structure making up the NFT to diffuse to the peg tip. The annealing can include an annealing step that is specifically designed to affect this diffusion, it can be done through the operation of the HAMR head itself as it heats up when utilized, or combinations thereof. Multilayer structures can be advantageous for facilitating diffusion because diffusion is more likely to occur and/or quicker at interfaces than it is in the bulk of a material. Therefore, by forming more interfaces (each layer of metal and adjacent layer of plasmonic material forms an interface), diffusion of the metal to the peg tip can be facilitated, increased, sped up, or any combination thereof.

Another method combines formation of one or more co-sputtered alloy layers with a multilayer structure including distinct layers of plasmonic material and metal. In some embodiments, a specific illustrative overall structure that could be formed in a NFT can include the following layers: plasmonic material layer (e.g., 5 nm)/plasmonic material-secondary atom co-sputtered alloy layer (e.g., 2% secondary atom, total thickness 5 nm)/plasmonic material layer (e.g., 2 nm)/secondary atom layer (e.g., 1 nm)/plasmonic material layer (e.g., 2 nm)/plasmonic material-secondary atom co-sputtered alloy layer (e.g., 2% secondary atom, total thickness 5 nm)/plasmonic material layer (e.g., 2 nm). The total thickness of this illustrative structure would be about 25 nm. It should be noted however, that structures including other specific materials could have different thicknesses. For example, a multilayer structure that includes rhodium (Rh) as the plasmonic material could have a thickness of about 45 nm. Such a structure could take advantage of both grain boundary and bulk diffusion offered by the co-sputtered alloy layers and interface diffusion offered by the multiple interfaces to facilitate, speed up, increase, or combinations thereof diffusion to the peg tip.

Figure 4:
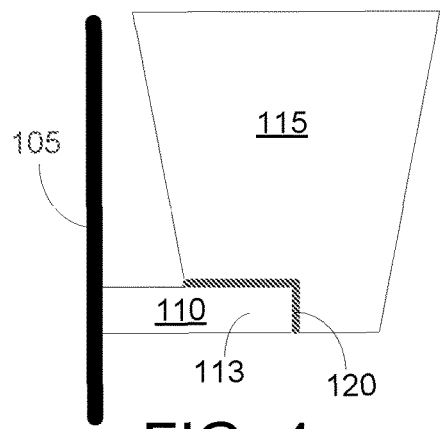
FIG. 4 is a schematic illustration of a disclosed embodiment of a NFT that includes a block of secondary atom(s) material.

Another method includes formation of a block of the secondary atom. FIG. 4 illustrates a possible embodiment of such a structure. As seen in FIG. 4, the peg 110 has its front at the ABS, 105 and has an opposing back region 113. Located behind the peg 110 is the disc/heat sink 115. The peg and the disc/heat sink function together to gather energy input therein and focus it, via the peg 110 to obtain a smaller spot of energy which is then output to associated magnetic media. Adjacent the back region 113 of the peg 110 is a block 120. The block 120 can generally be described as being positioned between the peg 110 and the disc/heat sink 115. The block 120 is made of one or more than one of the secondary atoms discussed above. Once the structure depicted in FIG. 4 has been formed (through known patterning and formation methods typically utilized in wafer processing) a HOC is deposited on the front of the peg and the ABS, 105 is formed through regular slider processing. Then, a heat treatment can be applied to the structure. It should also be noted that the heat treatment can be done before (or both before and after) the HOC is deposited. The heat treatment is designed to cause the secondary atom (e.g., the metal) from the block 120 to diffuse to the peg tip. The annealing can include an annealing step that is specifically designed to affect this diffusion, it can be done through the operation of the HAMR head itself as it heats up when utilized, or combinations thereof. In some embodiments, the addition of a block (such as that depicted in FIG. 4) can be utilized with co-sputtered alloys, multilayer structures or combinations thereof.

Any combination of various methods/structures disclosed herein can be utilized in order to affect diffusion of a secondary atom(s) to the tip of the peg. All (or combinations thereof) of these structures and/or formation processes are designed to drive the secondary atom towards the tip of the peg in order to prevent or minimize plasmonic material atoms and/or vacancies from migrating in order to stop void growth at the peg tip and thus make the NFT structure more stable; prevent or cut off the diffusion path by forming an oxide at the peg tip; or combinations thereof.

In some embodiments, methods, structures, or combinations thereof can be utilized to concentrate the secondary atom(s) in a region of the peg adjacent the ABS. In some embodiments, disclosed NFTs include a peg where the concentration of the secondary atom is higher at a region of the peg adjacent the ABS than the concentration of the secondary atom is throughout the bulk of the peg. In some embodiments, methods, structures, or combinations thereof can be utilized to concentrate the secondary atom(s) in the first 2 nm of the peg at the ABS, the first 5 nm of the peg at the ABS, or the first 10 nm of the peg at the ABS. In some embodiments, the first 2 nm (first 5 nm, or first 10 nm) of the peg at the ABS will have a higher concentration of secondary atom(s) than the remaining portions of the peg. The concentration of the secondary atom(s) in various regions of the peg can be detected and quantified using known techniques, including for example chemical mapping techniques that have spatial resolution, including for example energy dispersive X-ray spectroscopy (EDX) analysis, transmission electron microscopy (TEM), and electron energy loss spectroscopy (EELS). Alternatively, chemical line scans can be done using similar techniques and measurement devices.

Any of the methods of affecting diffusion of the secondary atom to the tip of the peg can also be combined with an optional step of oxidizing some of the secondary atom(s) at the peg tip. The optional oxidation step can be affected using any known methods of oxidation, including for example annealing in an environment containing oxygen (O2), air, or other oxygen containing gases. Depending on the technique, the oxygen affinity of the secondary atom can also be considered. Oxidation of a portion of the secondary atoms, e.g., the secondary atoms that have diffused all the way to the front few monolayers of the peg could provide additional adhesion benefits for maintaining adhesion between the peg and the overlying overcoat. In some embodiments, this oxidation step can occur before the head overcoat is deposited at the ABS. Forming a layer of oxide at the tip of the peg in this way would be much more likely to better align the oxidized material with the peg because the material being oxidized would be coming out of the peg itself. As such, it could be advantageous in comparison to a method of patterning an oxide layer on the surface of the peg.

All scientific and technical terms used herein have meanings commonly used in the art unless otherwise specified. The definitions provided herein are to facilitate understanding of certain terms used frequently herein and are not meant to limit the scope of the present disclosure.

As used in this specification and the appended claims, "top" and "bottom" (or other terms like "upper" and "lower") are utilized strictly for relative descriptions and do not imply any overall orientation of the article in which the described element is located.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise. The term "and/or" means one or all of the listed elements or a combination of any two or more of the listed elements.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising" and the like. For example, a conductive trace that "comprises" silver may be a conductive trace that "consists of" silver or that "consists essentially of" silver.

As used herein, "consisting essentially of," as it relates to a composition, apparatus, system, method or the like, means that the components of the composition, apparatus, system, method or the like are limited to the enumerated components and any other components that do not materially affect the basic and novel characteristic(s) of the composition, apparatus, system, method or the like.

The words "preferred" and "preferably" refer to embodiments that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure, including the claims.

Also herein, the recitations of numerical ranges by endpoints include all numbers subsumed within that range (e.g., 1 to 5 includes 1, 1.5, 2, 2.75, 3, 3.80, 4, 5, etc. or 10 or less includes 10, 9.4, 7.6, 5, 4.3, 2.9, 1.62, 0.3, etc.). Where a range of values is "up to" a particular value, that value is included within the range.

Use of "first," "second," etc. in the description above and the claims that follow is not intended to necessarily indicate that the enumerated number of objects are present. For example, a "second" substrate is merely intended to differentiate from another infusion device (such as a "first" substrate). Use of "first," "second," etc. in the description above and the claims that follow is also not necessarily intended to indicate that one comes earlier in time than the other.

Thus, embodiments of near field transducers (NFTs) and methods of forming NFTs are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation.

What is claimed is:

1. A device having an air bearing surface (ABS), the device comprising:
    a near field transducer, the near field transducer comprising a peg and a disc, the peg having a region adjacent the ABS, the peg comprising:
        a plasmonic material selected from gold (Au), silver (Ag), copper (Cu), ruthenium (Ru), rhodium (Rh), aluminum (Al), or combinations thereof; and
        at least one other secondary atom selected from germanium (Ge), tellurium (Te), aluminum (Al), antimony (Sb), tin (Sn), mercury (Hg), indium (In), zinc (Zn), iron (Fe), copper (Cu), manganese (Mn), silver (Ag), chromium (Cr), cobalt (Co), and combinations thereof, the concentration of the at least one secondary atom being not less than 0.001 at % and not greater than 30 at % in the peg.

2. The device according to claim 1, wherein the plasmonic material is gold (Au).

3. The device according to claim 1, wherein the at least one secondary atom is selected from: germanium (Ge), aluminum (Al), antimony (Sb), zinc (Zn), iron (Fe), copper (Cu), manganese (Mn), silver (Ag), chromium (Cr), cobalt (Co), or combinations thereof.

4. The device according to claim 1, wherein the at least one secondary atom is selected from: iron (Fe), cobalt (Co), germanium (Ge), aluminum (Al), antimony, or combinations thereof.

5. The device according to claim 1, wherein the at least one secondary atom is selected from mercury (Hg).

6. The device according to claim 1, wherein the NFT comprises a multilayer structure of alternating plasmonic material layers and secondary atom layers.

7. The device according to claim 1, wherein the NFT comprises an alloy of plasmonic material and secondary atom.

8. The device according to claim 1, wherein the peg comprises a back region opposite the ABS adjacent region and the device further comprises a block comprising the at least one secondary atom adjacent the back region of the peg.

9. The device according to claim 1, wherein the NFT comprises about 0.1 atomic percent to about 5 atomic percent of the at least one secondary atom.

10. The apparatus according to claim 1 further comprising an energy source.

11. A device comprising:
    a light source;
    a waveguide; and
    a near field transducer, the near field transducer comprising a peg and a disc, the peg having a region adjacent the ABS, the peg comprising:
    a plasmonic material selected from gold (Au), silver (Ag), copper (Cu), ruthenium (Ru), rhodium (Rh), aluminum (Al), or combinations thereof; and
    at least one other secondary atom selected from germanium (Ge), tellurium (Te), aluminum (Al), antimony (Sb), tin (Sn), mercury (Hg), indium (In), zinc (Zn), iron (Fe), copper (Cu), manganese (Mn), silver (Ag), chromium (Cr), cobalt (Co), and combinations thereof, the concentration of the at least one secondary atom being not less than 0.001 at % and not greater than 30 at % in the peg and wherein the light source, waveguide and near field transducer are configured to transmit light from the light source to the waveguide and finally the near field transducer.

12. The device according to claim 11, wherein the plasmonic material is gold (Au).

13. The device according to claim 11, germanium (Ge), aluminum (Al), antimony (Sb), zinc (Zn), iron (Fe), copper (Cu), manganese (Mn), silver (Ag), chromium (Cr), cobalt (Co), or combinations thereof.

14. The device according to claim 11, wherein the at least one secondary atom is selected from mercury (Hg).

* * * * *